United States Patent [19]
Larson et al.

[11] Patent Number: 5,302,237
[45] Date of Patent: Apr. 12, 1994

[54] LOCALIZED PLASMA PROCESSING

[75] Inventors: Donald R. Larson, Arvada; David L. Veasey, Boulder, both of Colo.

[73] Assignee: The United States of America as represented by the Secretary of Commerce, Washington, D.C.

[21] Appl. No.: 835,293

[22] Filed: Feb. 13, 1992

[51] Int. Cl.$^5$ ............................................. H01L 21/00
[52] U.S. Cl. ................................. 156/643; 156/345; 118/723 R; 219/121.36; 313/231.31; 315/111.21
[58] Field of Search ................. 156/643, 345; 118/723; 427/569, 446, 34, 294; 219/121.36, 121.4, 47, 48; 313/231.31, 231.51, 231.61; 315/111.21, 111.71

[56] References Cited

U.S. PATENT DOCUMENTS 3,969,813 7/1976 Minetti et al.
4,359,360 11/1982 Harris et al.
4,931,307 6/1990 Sugita et al. ..................... 156/643

FOREIGN PATENT DOCUMENTS 61-139029 6/1986 Japan.

OTHER PUBLICATIONS

"Rapid, Nonmechanical Damage-Free Figuring of Optical Surfaces Using a Plasma-Assisted Chemical Etching (PACE): Part I"; Zarowin et al.; Proc. SPIE; vol. 966; pp. 91-97; (1989).

"Rapid, Nonmechanical Damage-Free Figuring of Optical Surfaces Using Plasma-Assisted Chemical Etching (PACE)"; Bollinger et al.; Proc. SPIE; vol. 966; pp. 82-90 (1989).

"Localized Plasma Etching For Device Optimization"; Larson et al.; J. Vac. Sci.; vol. 10; No. 1; (Feb. 1992); pp. 27-29.

Primary Examiner—Brian E. Hearn
Assistant Examiner—George Goudreau
Attorney, Agent, or Firm—Harold A. Burdick

[57] ABSTRACT

An apparatus and method for down-stream plasma processing (both etching and plasma enhanced deposition) are disclosed wherein only a portion of the surface area of a substrate is exposed to the low pressure, reactive gaseous processing environment. The remainder of the substrate remains outside a small enclosed processing area, thus leaving these areas unexposed to the processing agents and providing physical access for monitoring equipment or the like, for example when in-situ monitoring during processing is desired. Etch rates of up to 6 μm/h have been obtained.

18 Claims, 2 Drawing Sheets

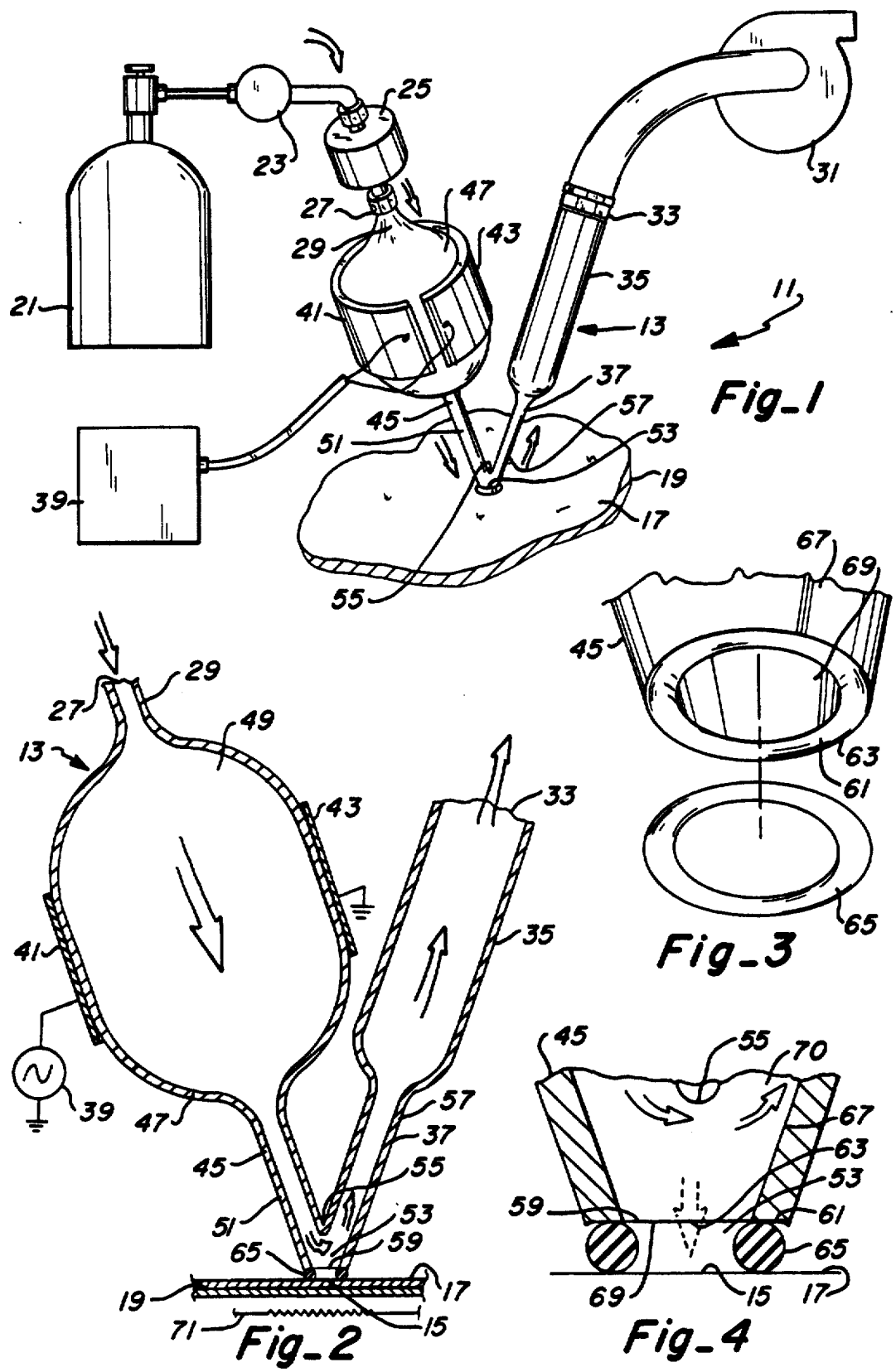

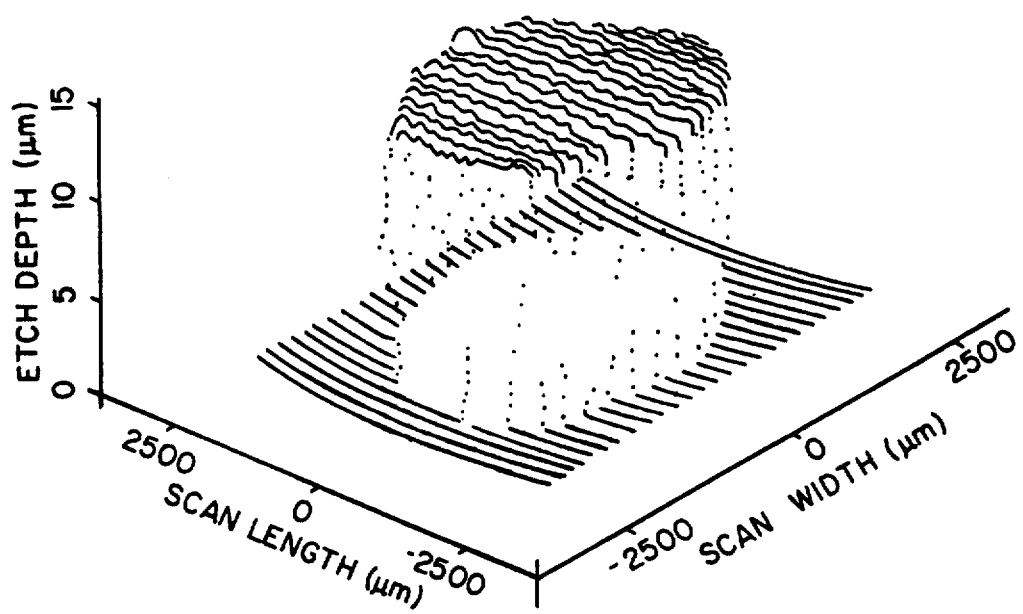
Fig_5
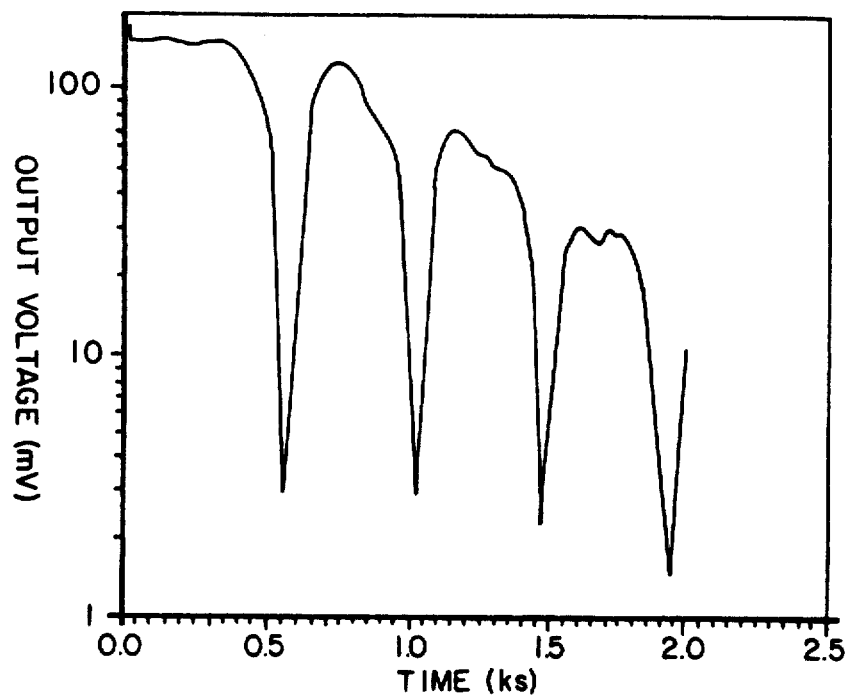
Fig_6

LOCALIZED PLASMA PROCESSING

FIELD OF THE INVENTION

This invention relates to plasma processing of substrates, and, more particularly, relates to apparatus and methods for plasma etching and/or deposition.

BACKGROUND OF THE INVENTION

Plasma processing (both etching and depositing) is widely used in the semiconductor industry, and plasma based etching and deposition equipment is widely utilized. Many integrated circuits undergo at least one plasma etch or plasma deposition step during fabrication, and semiconductor based devices, such as pressure sensors, optical detectors for channel optical waveguides and the like, usually undergo a plasma based processing step in their manufacture.

Plasma deposition is often referred to as plasma enhanced chemical vapor deposition (or PECVD). Plasma etching in general encompasses several different processes including conventional plasma etching, reactive ion etching (or RIE), reactive ion beam etching (or RIBE), and down-stream etching, a recently developed process wherein ions are generated in one region of a chamber and utilized for etching in a different region of the chamber. Heretofore known and utilized equipment, however, requires that the entire unit to be processed, for example a wafer, be subjected to processing.

For example, known methods of plasma etching or deposition require that a whole wafer be placed in a small vacuum chamber. The air is pumped out and appropriate gases are admitted into the chamber with very precisely controlled flow rates. A typical plasma processing system includes a pair or parallel electrode plates arranged inside the chamber. The wafer or wafers (often 2 to 6 inch silicon substrates) are placed on one of these plates. The plate is either heated or cooled and a DC or RF generator is utilized to generate a field between the parallel plates. The field ionizes the gases and they either form volatile compounds when impinging on the substrate and thus etch, or they are utilized for deposition of a material on the heated substrate.

While in-situ monitoring of semiconductor device properties during plasma processing would be very desirable in many cases, such is extremely difficult within the confines of a chamber where monitoring equipment is exposed to a volatile chemical and physical environment. In addition, while various devices for performing isolated processing of substrates have been heretofore suggested and/or utilized (see, for example, U.S. Pat. Nos. 4,359,360 and 3,969,813), such heretofore known devices have not provided for plasma processing equipment, have not always proven effective for processing operations requiring controllable etch rates and etch depths of only a small area of an unmasked substrate, and have not provided for access to the substrate for monitoring of device performance parameters during processing and/or etch or deposition control.

SUMMARY OF THE INVENTION

This invention provides an apparatus and method for localized plasma processing of the surface of a unit that is especially useful when only a portion of a substrate requires processing or reprocessing and/or when in-situ monitoring of unit performance parameters and/or processing parameters is required.

The apparatus includes a partial enclosure having an open side which in part defines a processing area and which has an access for receipt therethrough of a plasma processing agent, for example plasma created reactive species or plasma enhanced chemical vapor. A seal positioned at the open side of the partial enclosure is utilized to establish a seal between the partial enclosure and the surface of the unit surrounding the portion to be processed so that the processing area is established by the partial enclosure, the seal and the portion of the surface of the unit to be processed.

Plasma formation occurs in a chamber upstream from the partial enclosure which has electrodes positioned exteriorly thereof, and an evacuation pathway is provided for removal from the processing area of volatile reaction products or the like. The apparatus is connected with known components for plasma processing such as an RF or DC generator, a gas supply and regulator, mass flow controller, and vacuum pump.

The apparatus is compact and preferably unitarily formed from a conduit shaped to define a vertex at one part thereof between an inlet and an outlet, an opening being formed at the vertex and having the seal positionable thereat, with the plasma formation chamber being defined by an enlarged section of the conduit between, but spaced from, the vertex of the conduit and the inlet.

It is therefore an object of this invention to provide an apparatus and method for processing a portion of a surface of a unit utilizing a plasma processing agent while leaving other portions of the unit unexposed to the processing agent and available to physical access during processing.

It is another object of this invention to provide an apparatus for processing a portion of a surface of a unit which includes a partial enclosure having an open side and in part defining a processing area, the enclosure having an access for a plasma processing agent to the processing area, and a seal at the open side of the partial enclosure for releasably establishing a seal between the partial enclosure and the surface of the unit surrounding the portion of the surface to be processed so that the processing area is established by the partial enclosure, the seal and the portion of the surface of the unit to be processed.

It is another object of this invention to provide an apparatus for plasma processing of a portion of a surface of a unit which includes a conduit shaped to define a vertex at one part thereof between an inlet and an outlet of the conduit, the conduit having an opening formed at the vertex, and a seal at the opening of the conduit for releasably establishing a seal between the conduit at the opening and the surface of the unit surrounding the portion of the surface to be processed so that a processing area is established by the conduit at the vertex, the seal and the portion of the surface of the unit to be processed.

It is still another object of this invention to provide an apparatus for processing a portion of a surface of a unit utilizing a plasma processing agent while leaving other portions of the unit unexposed to the processing agent and available to physical access during processing which includes a plasma formation chamber upstream of a processing area.

It is yet another object of this invention to provide a method for plasma processing of a portion of a surface of a unit including the steps of enclosing a processing area adjacent to the portion of the surface of the unit to be processed, the processing area being in part enclosed by the portion of the surface to be processed, and providing an access for a plasma processing agent to the processing area.

With these and other objects in view, which will become apparent to one skilled in the art as the description proceeds, this invention resides in the novel construction, combination, arrangement of parts and method substantially as hereinafter described, and more particularly defined by the appended claims, it being understood that changes in the precise embodiment of the herein disclosed invention are meant to be included as come within the scope of the claims.

BRIEF DESCRIPTION OF THE DRAWINGS

The accompanying drawings illustrate a complete embodiment of the invention according to the best mode so far devised for the practical application of the principles thereof, and in which:

FIG. 1 is a perspective view of the apparatus of this invention with other operational features illustrated diagrammatically;

FIG. 2 is a schematic sectional view of the apparatus of FIG. 1;

FIG. 3 is a partial perspective view of one end of the apparatus of this invention;

FIG. 4 is a schematic sectional view of the end of the apparatus illustrated in FIG. 3;

FIG. 5 is a graphic presentation of surface profilometer data; and

FIG. 6 is a graphic presentation of optical transmission data as monitored during etching of a portion of a substrate utilizing the apparatus of this invention.

DESCRIPTION OF THE INVENTION

Small downstream plasma processing (etching or plasma enhanced vapor deposition) system 11 is illustrated in FIG. 1 including plasma processing apparatus 13 that exposes only a very small portion 15 of surface, or substrate, 17 of unit 19, for example a wafer, to plasma processing agents (such as plasma enhanced vapor for deposition or reactive species for etching) and the vacuum environment.

System 11 includes conventional plasma processing system components such as gas supply (or supplies) 21, regulator (or regulators) 23, and mass flow controller 25 connected with inlet 27 at the upper part of access conduit 29 of apparatus 13, and vacuum pump 31 connected with outlet 33 of enlarged portion 35 of evacuation pathway conduit 37 (such connections being accomplished in any conventional manner, for example utilizing flexible tubing and clamps or threaded fittings). An RF generator (a DC generator could be utilized) 39 is connected with electrode plates (a coil could also be utilized) 41 and 43.

As shown in FIGS. 1 through 4, apparatus 13 is preferably unitarily fabricated from a substantially transparent material (for example a glass such as borosilicate glass or plastic such as Lucite or other substantially inert material) tubing 45 having a wall thickness sufficient to withstand the reduced pressures inherent in plasma processing. Upper access conduit 29 extends to enlarged portion 47 of tubing 45 which constitutes plasma formation chamber 49 therein. Lower access conduit 51 extends from chamber 49 to processing area 53. Tubing 45 is shaped to form vertex 55 (for example by bending during blowing of a glass tubing) at the junction of lower access conduit 51 and lower portion 57 of evacuation conduit 37. Opening 59 is formed at vertex 55.

By way of example, a 6.35 mm (about ¼ inch) diameter tube is expanded to 50 mm (about 2 inches) during fabrication, to form chamber 49. Chamber 49 tapers back to a 6.35 mm tube (at lower access conduit 51). The tubing wall, in the case of a glass tubing, should be about 1 mm thick. Lower access conduit 51 and chamber 49 may each be, for example, about 38 mm (about 1.5 inches) long. The lower portion of the tubing is bent to form a V shape, vertex 55 of which is ground flat to form opening 59 having a diameter of about 1 mm. Groove 61 is ground in face 63 of tubing 45 at opening 59.

Seal 65, for example an elastomer O-ring made of Viton or the like (and having a material diameter of about one-sixteenth of an inch for use in the above described apparatus), is seated in groove 61 and is used to create a vacuum seal between the ground face 63 and surface 17. A very small amount of vacuum grease applied to seal 65 aids establishment of the vacuum seal.

As best illustrated in FIG. 4, the lower portion of tubing 45 at vertex 55 forms partial enclosure 67 having an open side 69. When the vacuum seal is established, the substantially enclosed processing area 53 is defined by partial enclosure 67, seal 65 and portion 15 to be processed of surface 17 of unit 19.

In use, the above described apparatus can achieve a level of vacuum of about 0.2 Pa (0.1 mTorr) utilizing a two-stage mechanical pump. For etching, the etchant gases enter apparatus 13 by way of inlet 27 and are pumped through the larger plasma chamber 49 and downstream past vertex 55 and through evacuation conduit 37. A 13.56 MHz RF generator 39 is coupled to electrodes 41 and 43, a pair of copper, nickel or other suitable metal foil plate electrodes each of which partially surround (to within one-quarter inch of each other) the exterior of enlarged tube portion 47 defining plasma chamber 49.

To excite the plasma in chamber 49, typically only about 1 W of RF power is coupled to the gasses in chamber 49. Mass flow controller 25 controls the flow of the etchant gases (for example, a tetrafluoromethane (83%) and oxygen (17%) mixture to etch silicon, a-Ge:H and a-Si:H). Flow rates may be varied between about $4.2 \times 10^{-5}$ and $7.3 \times 10^{-5}$ L/s (2.6 and 4.4 sccm). The pressure, measured at the location of the substrate, varies from between about 90 to 110 Pa (675 to 820 mTorr).

In operation, the plasma creates reactive species in the larger diameter chamber 49. The reactive species are pumped downstream past opening 59 in partial enclosure 67 where they interact with portion 15 of the substrate. The volatile reaction products are then pumped out of the system through outlet 70 from partial enclosure 67 leading to evacuation conduit 37.

For plasma enhanced vapor deposition the same apparatus is utilized, and only the process changes. Heater 71 is utilized to heat portion 15 to be processed, for example to about 180° C. Again vacuum pump 31 lowers pressure in apparatus 13 and gas is pumped through the apparatus (for example, silane gas). Plasma is excited at chamber 49 and the plasma enhanced vapor is pumped downstream past vertex 55 for processing of portion 15 at processing area 53 (again, flow rates of about 10 sccm and pressure of about 600 mTorr are achieved).

The compact design of apparatus 13 leaves ample space for monitoring apparatus and easy access to the edges of the substrate, for example for coupling light into waveguides as discussed below.

One example of the beneficial use of apparatus 13 is illustrated by an attempt to optimize the photoresponse of optical detectors integrated with channel optical waveguides. Numerical models and experimental data have indicated that coupling light from the waveguide to the semiconductor cladding is critically dependent on the thickness of the semiconductor. The efficiency of this coupling affects the photoresponse of the optical detector. Optimizing the photoresponse requires controlling the thickness to a tolerance of about 20 nm.

Experimental verification of the numerical model and optimization of the detector efficiency could be accomplished most easily by monitoring the transmission of light in the waveguide passing underneath the semiconductor cladding layer while thinning that layer.

Apparatus 13 and system 11 have been used to etch test patterns in silicon wafers and to improve the responsivity of optical detectors deposited on glass, integrated optical waveguides. The 5 $\mu$m wide, 25 mm long channel waveguides in the surface of a glass substrate are formed, for example by potassium-sodium ion exchange, and the edges of the substrate are polished to allow end-fire coupling of light into the waveguides. Plasma-enhanced chemical vapor deposition (utilizing apparatus 13 or other means) is used to deposit a-Si:H or a-Ge:H film on the glass substrate. Standard photolithography and plasma etching processes can be used to form 1.2 mm by 2 mm islands of the amorphous semiconductors. Each island was centered on a waveguide and creates a four-layer waveguiding structure.

When plotted as a function of film thickness, the absorption of light in the four-layer waveguide exhibits very narrow maxima. These maxima may be as narrow as 20 nm. The change in optical absorption with decreasing semiconductor cladding thickness was monitored during processing utilizing system 11 by measuring the transmission of light past the semiconductor island (see FIG. 6). The amorphous semiconductor film absorbs the coupled light and the total transmitted light exhibits very narrow minima as a function of thickness. After the individual islands were etched to the desired thickness utilizing the apparatus of this invention, the apparatus was removed and the optical absorption was again measured. No change in absorption was observed. Rectifying metal contacts were vacuum deposited and the resulting optical detectors were evaluated.

Monitoring the transmitted light required that light from a laser be focused with a microscope objective onto the polished edge of the substrate at the end of the waveguide. The light from the output of the waveguide was collected with another microscope objective and imaged onto a silicon detector. A chopper and a lock-in amplifier were also used. Attempting to do this inside a plasma etching chamber would have been extremely difficult and destructive to all standard optical components.

Utilizing apparatus 13, the plasma is substantially confined to plasma chamber 49 and no distinctive glow is visible in the smaller diameter downstream tubing. The region of the substrate that is etched is delineated by elastomer seal 65 and not by opening 59 in tubing 45. For example, in the above described apparatus having opening 59 of about 1 mm in diameter, any of several larger diameter elastomer O-rings may be used as seal 65 (from about 1 mm to 5 mm), the diameter of the processed portion 15 of the substrate being the same as the mean diameter of the O-ring utilized.

For use in etching processes, the etch rate achieved is dependent on the power coupled to the plasma and the plasma chamber pressure. As described above, etch rates up to 6 $\mu$m/h have been measured utilizing system 11. In addition, etch uniformity is substantial utilizing system 11. For example, a silicon substrate was stripped of oxide using a buffered HF solution and rinsed in deionized, filtered water. Various locations on the substrate were etched using system 11 and etch profiles measured with a surface profilometer. The spatial uniformity of the etch was very good, as shown in the surface profilometer data plotted in FIG. 5. The depth of this etch illustrated is 12 $\mu$m with approximately 0.5 $\mu$m variations.

The etch rate achieved by system 11 is constant as evidenced by the regularity of the appearance of optical transmission minima depicted in FIG. 6 and gathered as above described. At vertex 55 of the tubing 45, the reactive species appear to diffuse through the opening 59 to the desired portion 15. The gas flow has been visualized by using a Telsa coil to excite a plasma in lower access conduit 51. The gas flow was located close to the inside of the bend in tubing 45 at vertex 55 away from opening 59. Even though most of the gases are being quickly pumped past opening 59, diffusion appears to occur relatively efficiently. This conclusion is indicated by the practical etch rates achieved. Diffusion is also indicated by the etch uniformity as illustrated in FIG. 5, as no gas flow pattern is replicated in the etched substrate.

As may be appreciated from the foregoing, an apparatus and method are provide whereby plasma processing, such as etching, just a small region of a wafer or even a die is possible. This apparatus and method may be useful in the optimization, fabrication, refabrication and/or repair of several types of devices, and may have many other applications including increasing the resistance of diffused or thin film resistors by thinning and semiconductor piezoelectric device optimization by localized etching. Failure analysis also may benefit from spatially selective etching. A single die can be etched and examined while leaving the rest of the wafer unaltered and available for other tests.

It is possible to modify this process to permit low temperature PECVD to be performed on a small area of a substrate using apparatus 13. The only modifications required are the gases used and heating of the substrate. Elastomer seals that can withstand the elevated temperatures are available.

By confining the reactive gases to the minimum region required, monitoring equipment can make contact with the substrate during processing but still be located outside the plasma chamber. While monitoring with optical probes has been discussed, with proper RF shielding electrical probes also may be used.

What is claimed is:

1. An apparatus for processing a portion of a surface of a unit utilizing a plasma processing agent while leaving other portions of the unit unexposed to the processing agent and accessible during processing, said apparatus comprising:

a partial enclosure having an open side and in part defining a processing area, said enclosure having an access for the plasma processing agent to the processing area and an outlet from said processing area;

a plasma formation chamber upstream of said processing area and communicating therewith through said access;

pumping means connected with said outlet from said processing area for pumping reactive species created in said formed plasma from said formation chamber to said processing area; and sealing means at said open side of said partial enclosure for releasably establishing a seal between said partial enclosure and the surface of the unit surrounding the portion of the surface to be processed so that said processing area is established by said partial enclosure, said sealing means and the portion of the surface of the unit to be processed.

2. The apparatus of claim 1 further comprising an evacuation conduit connected at said outlet from said processing area.

3. The apparatus of claim 1 wherein said chamber has electrode means adjacent to the exterior thereof and connectable to a generator for exciting a plasma in said chamber.

4. The apparatus of claim 1 further comprising heating means positioned externally of said processing area for heating the portion of the surface of the unit to be treated.

5. The apparatus of claim 1 further comprising an evacuation conduit connected with said outlet from said processing area, said pumping means connected with said evacuation conduit, and a mass flow controller connected with said access.

6. An apparatus for processing a portion of a surface of a unit utilizing a plasma processing agent while leaving other portions of the unit unexposed to the processing agent and accessible during processing, said apparatus comprising:

a conduit shaped to define a vertex at one part thereof between an inlet and an outlet of said conduit, said conduit having an opening formed at said vertex; and sealing means at said opening of said conduit for releasably establishing a seal between said conduit at said opening and the surface of the unit surrounding the portion of the surface to be processed so that a processing area is established by said conduit at said vertex, said sealing means and the portion of the surface of the unit to be processed.

7. The apparatus of claim 6 wherein said conduit has an enlarged portion forming a chamber between and spaced from said inlet and said vertex for plasma formation therein.

8. The apparatus of claim 7 wherein said enlarged portion of said conduit has electrode means adjacent to the exterior thereof and connectable to a generator for exciting a plasma in said chamber.

9. The apparatus of claim 7 wherein said conduit is formed of a substantially transparent material.

10. The apparatus of claim 6 wherein said sealing means is a ring seal made of non-volatile material.

11. The apparatus of claim 6 wherein said conduit at said opening has a groove formed therein for seating of said sealing means.

12. A method for processing a portion of a surface of a unit utilizing a plasma processing agent while leaving other portions of the unit unexposed to the processing agent and accessible during processing, said method comprising:

establishing an enclosed processing area adjacent to the portion of the surface of the unit to be processed, said enclosed processing area being defined in part by the portion of the surface to be processed;

exciting the plasma processing agent in a chamber upstream of said processing area;

providing an access for the plasma processing agent to said processing area; and pumping reactive species created in said excited plasma processing agent from said chamber to said processing area.

13. The method of claim 12 wherein said processing area is in part defined by an enclosure having an open side, the method further comprising the step of establishing a seal between said enclosure at said open side and the surface of the unit adjacent to the portion of the surface to be processed.

14. The method of claim 13 further comprising the step of establishing a level of vacuum in said processing area, with said level of vacuum aiding establishment of said seal.

15. The method of claim 12 wherein the processing is plasma deposition, wherein the processing agent is plasma enhanced chemical vapor, and wherein the method further comprises the step of heating the portion of the surface of the unit to be processed externally of said processing area.

16. The method of claim 12 further comprising the step of providing an evacuation pathway from said processing area.

17. The method of claim 16 wherein said access, said pathway and said processing area are formed by a conduit shaped to define a vertex, an opening in said conduit at said vertex being established, and said processing area being in part enclosed by said conduit at said vertex.

18. The method of claim 12 further comprising the step of coupling performance monitoring equipment to the other portions of the unit to monitor a selected parameter of unit performance during processing.

* * * * *